(12) United States Patent
Ho et al.

(10) Patent No.: US 6,488,509 B1
(45) Date of Patent: Dec. 3, 2002

(54) PLUG FILLING FOR DUAL-DAMASCENE PROCESS

(75) Inventors: Bang-Chein Ho, Hsinchu (TW); Jian-Hong Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/055,092

(22) Filed: Jan. 23, 2002

(51) Int. Cl.$^7$ .......................................... H01L 21/4763
(52) U.S. Cl. ........................................................ 437/638
(58) Field of Search ................................ 438/622, 634, 438/637, 638, 672, 788

(56) References Cited

U.S. PATENT DOCUMENTS

| | | | |
|---|---|---|---|
| 5,635,423 A | 6/1997 | Haung et al. | 437/195 |
| 5,877,076 A * | 3/1999 | Dai | 438/597 |
| 5,920,790 A | 7/1999 | Wetzel et al. | 438/618 |
| 6,033,977 A | 3/2000 | Gutsche et al. | 438/618 |
| 6,057,239 A | 5/2000 | Wang et al. | 438/689 |
| 6,096,655 A | 8/2000 | Lee et al. | 438/700 |
| 6,268,283 B1 | 7/2001 | Huang | 438/638 |
| 6,399,483 B1 * | 6/2002 | Liu et al. | 438/638 |
| 6,406,995 B1 * | 6/2002 | Hussein et al. | 438/638 |
| 6,420,261 B2 * | 7/2002 | Kudo | 438/638 |
| 2002/0042193 A1 * | 4/2002 | Noguchi et al. | 438/687 |

* cited by examiner

Primary Examiner—John F. Niebling
Assistant Examiner—Lynne Gurley
(74) Attorney, Agent, or Firm—George O. Saile; Stephen B. Ackerman; Stephen G. Stanton

(57) ABSTRACT

A method of fabricating a dual-damascene structure comprising the following steps. A structure having a patterned low-k material layer formed thereover is provided. The patterned low-k material layer having an upper surface and at least one via hole formed therethrough. A plug material layer is formed over the patterned low-k material layer and filling the at least one via hole. The plug material layer being comprised of a material dissolvable in TMAH or deionized water. The plug material layer is developed to form a plug within the respective at least one via hole having a height below the upper surface of the patterned low-k material layer. The plug is baked to crosslink the plug material comprising the plug. A trench masking layer is formed and patterned to form a patterned trench masking layer having at least one trench substantially centered over the respective at least one via hole and exposing a portion of patterned low-k material layer adjacent the at least one via hole. Wherein the crosslinked plug material comprising the plug does not adversely interact with the trench masking layer. The patterned low-k material layer is etched at the exposed portion using the patterned trench masking layer as a mask to form a trench opening substantially centered over the via hole. The etching of the patterned low-k material layer also removing some of the plug to form a partially etched plug. The trench opening and the via hole comprising a dual-damascene opening. The partially etched plug is removed from the via hole. A planarized dual-damascene structure is formed within the dual-damascene opening.

45 Claims, 5 Drawing Sheets

Polyimide

Polyamide

PLUG FILLING FOR DUAL-DAMASCENE PROCESS

FIELD OF THE INVENTION

The present invention relates generally to semiconductor fabrication and more specifically to methods of forming dual-damascene structures.

BACKGROUND OF THE INVENTION

The current plug filling processes for dual-damascene processes have fencing issues or involve additional process steps and increased processing costs to alleviate the fencing issues.

U.S. Pat. No. 6,268,283 B1 to Huang describes a dual-damascene process using a resist cap in the dual-damascene opening.

U.S. Pat. No. 6,057,239 to Wang et al. describes a dual-damascene process using a sacrificial plug.

U.S. Pat. No. 6,033,977 to Gutsche et al. describes another dual-damascene process also using a sacrificial plug.

U.S. Pat. No. 6,096,655 to Lee et al., U.S. Pat. No. 5,635,423 to Huang et al. and U.S. Pat. No. 5,920,790 to Wetzel describe related dual-damascene processes.

SUMMARY OF THE INVENTION

Accordingly, it is an object of one or more embodiments of the present invention to provide an improved method of forming a dual-damascene structure.

Other objects will appear hereinafter.

It has now been discovered that the above and other objects of the present invention may be accomplished in the following manner. Specifically, a structure having a patterned low-k material layer formed thereover is provided. The patterned low-k material layer having an upper surface and at least one via hole formed therethrough. A plug material layer is formed over the patterned low-k material layer and filling the at least one via hole. The plug material layer being comprised of a material dissolvable in TMAH or deionized water. The plug material layer is developed to form a plug within the respective at least one via hole having a height below the upper surface of the patterned low-k material layer. The plug is baked to crosslink the plug material comprising the plug. A trench masking layer is formed and patterned to form a patterned trench masking layer having at least one trench substantially centered over the respective at least one via hole and exposing a portion of patterned low-k material layer adjacent the at least one via hole. Wherein the crosslinked plug material comprising the plug does not adversely interact with the trench masking layer. The patterned low-k material layer is etched at the exposed portion using the patterned trench masking layer as a mask to form a trench opening substantially centered over the via hole. The etching of the patterned low-k material layer also removing some of the plug to form a partially etched plug. The trench opening and the via hole comprising a dual-damascene opening. The partially etched plug is removed from the via hole. A planarized dual-damascene structure is formed within the dual-damascene opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
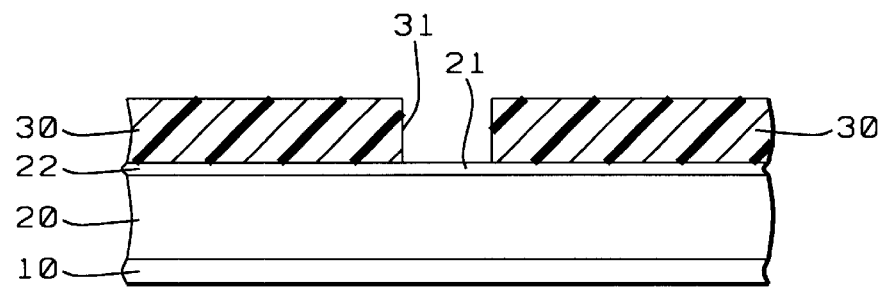
FIGS. 1 to 7 schematically illustrate a preferred embodiment of the present invention.

As shown in FIG. 1, structure 10 is preferably a semiconductor substrate formed of silicon and may include an overlying etch stop layer (not shown). Low-k material layer 20 is formed over structure 10 and is preferably formed of oxide or silicon oxide.

An optional anti-reflective coating (ARC) layer 22 may be formed over low-k material layer 20. ARC layer 22 is preferably comprised of an inorganic material such as SiON, SiOC, SiN or TaN.

A patterned via masking layer 30 is formed over optional ARC layer 22/low-k material layer 20 and includes at least one etch opening 31 exposing a portion 21 of ARC layer 22/low-k material layer 20. Via masking layer 30 is preferably formed of photoresist as shown in FIG. 1.

Formation of Via Hole 32

Figure 2:
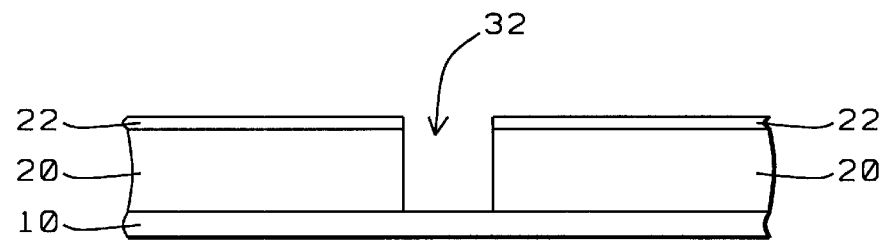

As shown in FIG. 2, ARC layer 22/low-k material layer 20 is etched at its exposed portion 21 using patterned via masking layer 30 as a mask to form a via hole 32. The patterned via masking layer 30 is then removed and the structure is cleaned as necessary.

Formation of Plug Material 40 to Fill Via Hole 32—Key Step of the Invention

Figure 3:
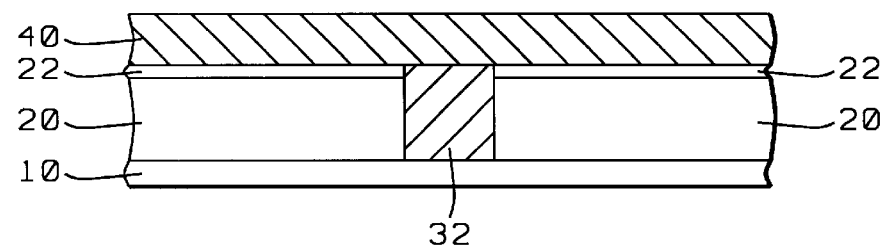

In a key step of the invention and as shown in FIG. 3, a plug material 40 that is dissolvable by tetramethyl ammonium hydroxide (TMAH) or deionized water (DIW) is formed over patterned ARC layer 22/low-k material layer 20, filling via hole 32. The plug material 40 of the present invention has functional groups such as —OH, —COOH or —CONH$_2$.

Figure 8A:
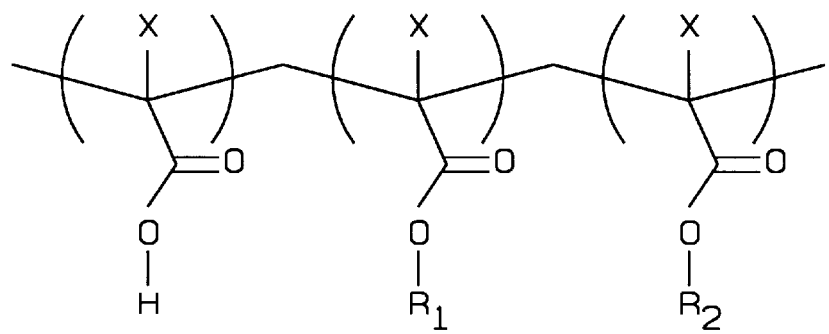
FIG. 8A illustrates a first preferred plug material of the present invention comprised of an acrylate polymer, copolymer or tertpolymer.
Figure 9:
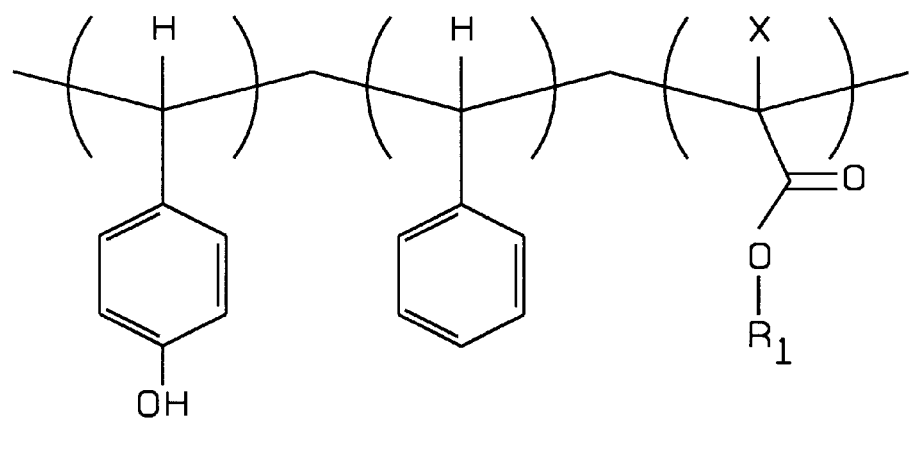
FIG. 9 illustrates a second preferred resin plug material of the present invention.
Figure 9:
Figure 9:
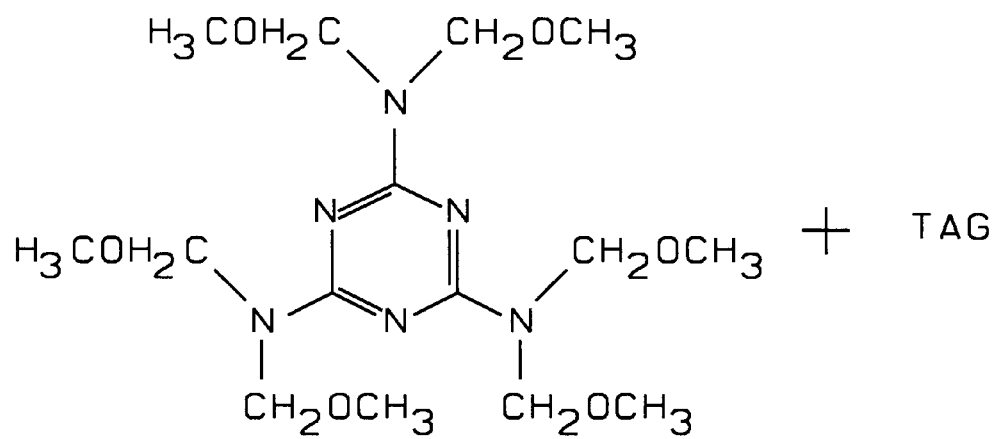
Figure 11A:
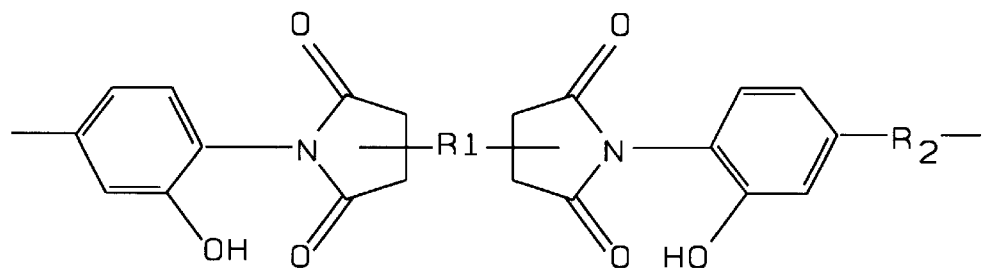
FIGS. 11A and 11B illustrate the fourth preferred plug material of the present invention comprised of a polyimide (FIG. 11A) or a polyamide (FIG. 11B).

Plug material 40 is preferably comprised of one of the following materials as shown in FIGS. 8A (acrylate polymer), 9, 10 and 11A (polyimide) or 11B (polyamide), more preferably one of the materials as shown in FIG. 8A (acrylate polymer), FIG. 9, FIG. 11A (polyimide) or 11B (polyamide) and is most preferably the material shown in FIG. 8A (acrylate polymer).

1. First preferred plug material as shown in FIG. 8A: acrylate polymer, copolymer or tertpolymer (where X=CH$_3$ or H);

2. Second preferred plug material as shown in FIG. 9: (I) from about 50 to 95% and more typically from about 60 and 90% of a resin comprised of: polyhydroxystyrene (PHS) (polymer resin); hydroxystyrene/styrene (copolymer resin); hydroxystyrene/acrylate (copolymer resin); or hydroxystyrene/styrene/acrylate (tertpolymer resin) that is combined with (II) from about 5 to 50% and more typically from about 7 to 25% of a melamine material and (III) from about 0.1 to 10% and more typically from about 0.1 to 3% of a thermal acid generator (TAG) such as 2, 4, 4, 6 tetrabromocylohexadienone, benzointosylate, 2-nitrobenzyltosylate or other alkyl esters of organic sulfonic acids.

Figure 10:
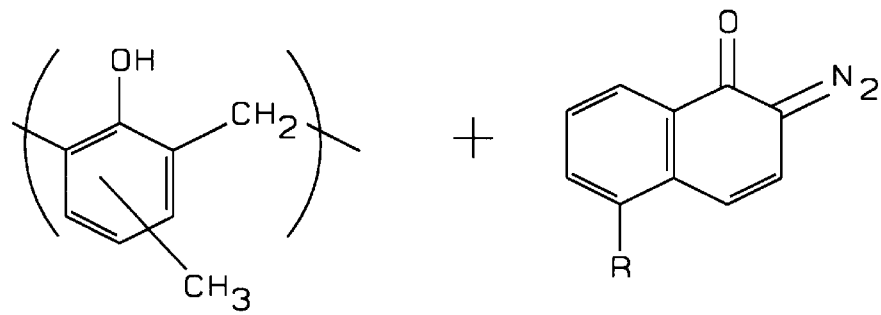
FIG. 10 illustrates a third preferred plug material of the present invention comprised of Novolak resin and DNQ.

3. Third preferred plug material as shown in FIG. 10: Novolak resin plus DNQ combined in the following ratio: preferably from about 100:30 to 100:5 and more preferably from about 100:20 to 100:5. It is noted that Novolak resin plus diazonaphoquinones (DNQ) in the ratio of about 100:20 Novolak:DNQ is known as an I-line or G-line photoresist but in the present invention, the ratio may be as noted above. Novolak resin is available from Shipley, JOK, Sumitomo or JSR, for example.

Figure 11B:
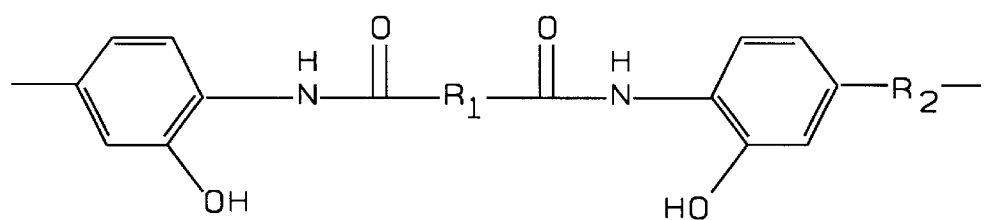

4. Fourth preferred plug material as shown in FIG. 11A and 11B: polyimide (FIG. 11A) or polyamide (FIG. 11B).

Development of Plug Material 40

Figure 4:
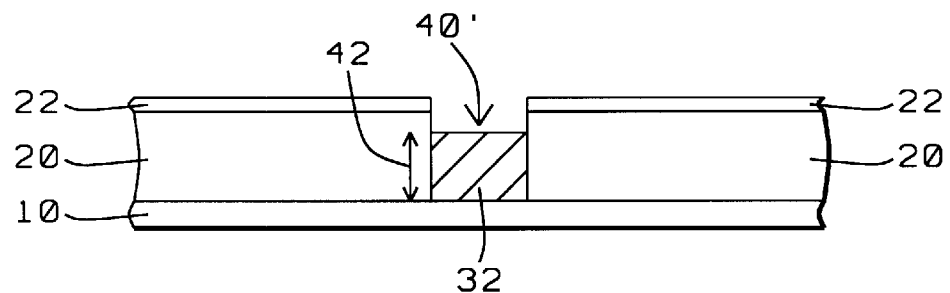

As shown in FIG. 4, plug material 40 is then simultaneously developed, and dissolved using TMAH or DIW leaving a plug 40' having a height 42. Plug height 42 is controlled by the developing time, as the longer the developing time the more plug material 40 is removed and the lower the height 42 of the remaining plug 40' comprised of developed plug material 40.

Baking of Developed Plug 40'

As shown in FIG. 4, the plug 40' comprised of developed plug material 40 is baked at a high temperature of preferably from about 150 to 350° C. and more preferably from about 150 to 250° C. for preferably from about 30 to 300 seconds and more preferably from about 45 to 120 seconds. This baking crosslinks the developed plug material 40 comprising plug 40' so that the crosslinked plug material 40 comprising plug 40' does not adversely interact with the subsequent trench masking layer 50 as described below.

Figure 8B:
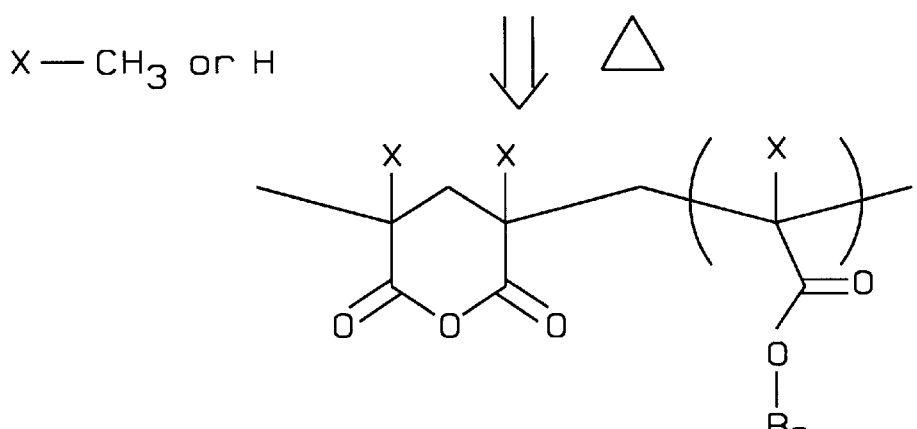
FIG. 8B illustrates the cross-linked structure of FIG. 8A.

Thus the first, second, third and fourth plug materials shown in FIGS. 8A, 9, 10 and FIGS. 11A and 11B, respectively, are crosslinked by this baking process to form respective crosslinked structures which will not adversely react with the subsequent trench masking layer 50. For example, FIG. 8B illustrates an example product of crosslinking the first preferred plug material as shown in FIG. 8A, i.e. acrylate polymer, copolymer or tertpolymer (where X=CH$_3$ or H).

Formation of Patterned Trench Masking Layer 50

Figure 5:
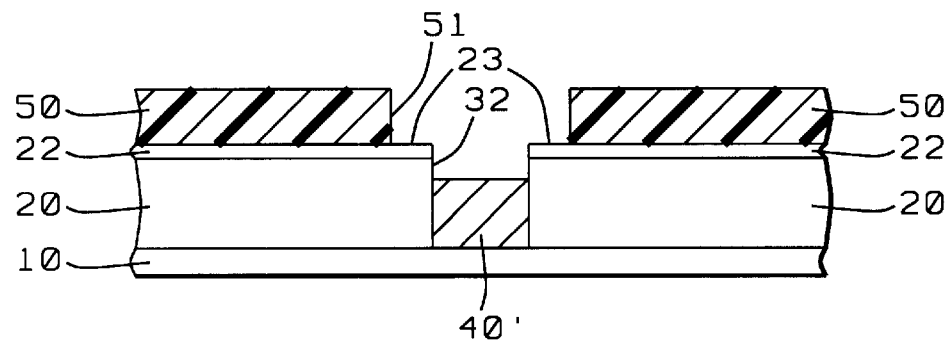

As shown in FIG. 5, a trench masking layer 50 is formed over the patterned ARC layer 22/low-k material layer 20 and over plug 40' comprised of crosslinked plug material 40, and is then patterned to form a patterned trench masking layer 50 having at least one trench opening 51 substantially centered over via hole 32 and exposing a portion 23 of ARC layer 22/low-k material layer 20. Trench masking layer 50 is preferably formed of spin coated photoresist developed by an alkaline developer as shown in FIGS. 5 and 6.

The use of the crosslinked plug material 40 of the present invention, prevents any adverse reaction between the plug 40' comprised of the crosslinked plug material 40 and the trench masking layer 50/patterned trench masking layer 50.

Formation of Trench Opening 52

Figure 6:
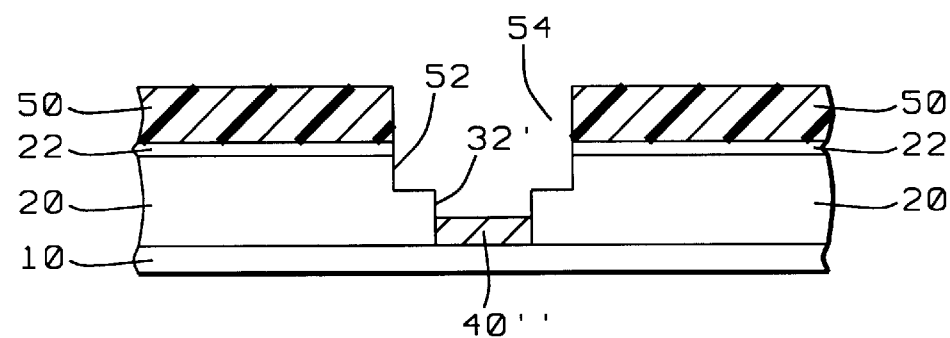

As shown in FIG. 6, ARC layer 22/low-k material layer 20 is etched at its exposed portion 23 using patterned trench masking layer 50 as a mask to form a trench opening 52 and an etched via opening 32'. This etch also etches a portion, but not all, of plug 40' to form partially etched plug 40" as shown in FIG. 6. Thus, plug 40' protects structure 10 from this etch and avoids any via hole punch-through into structure 10.

Trench opening 52 and etched via opening 32' form a dual-damascene opening 54.

Formation of Dual-damascene Structure 60

Figure 7:
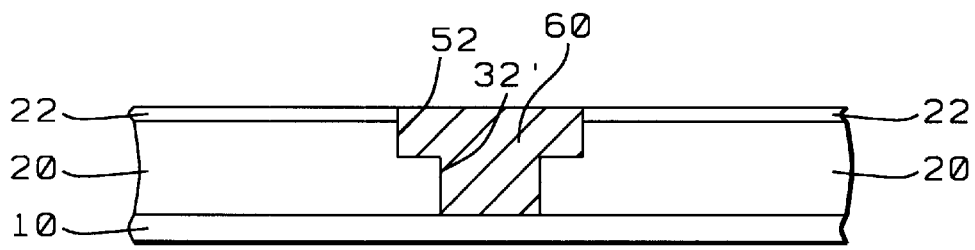

As shown in FIG. 7, partially etched plug 40" is removed from dual-damascene opening 54 and the structure is cleaned as necessary.

A metal layer is then formed over the etched ARC layer 22/low-k material layer 20, filling dual-damascene opening 54, and is then planarized, preferably by chemical mechanical polishing (CMP), to form a planarized dual-damascene structure 60 within the dual-damascene opening 54.

The metal comprising dual-damascene structure 60 is preferably comprised of copper, aluminum or gold and is more preferably comprised of copper.

Advantages of the Present Invention

The advantages of one or more embodiments of the present invention include:

1. there are no fencing issues during the trench etch process; and 2. the present invention reduces processing steps and processing costs.

While particular embodiments of the present invention have been illustrated and described, it is not intended to limit the invention, except as defined by the following claims.

We claim:

1. A method of fabricating a dual-damascene structure, comprising the steps of:

providing a structure having a patterned low-k material layer formed thereover; the patterned low-k material layer having an upper surface and at least one via hole formed therethrough;

forming a plug material layer over the patterned low-k material layer and filling the at least one via hole;

developing the plug material layer to form a plug within the respective at least one via hole having a height below the upper surface of the patterned low-k material layer;

baking the plug to crosslink the plug material comprising the plug;

forming and patterning a trench masking layer to form a patterned trench masking layer having at least one trench substantially centered over the respective at least one via hole and exposing a portion of patterned low-k material layer adjacent the at least one via hole; wherein the crosslinked plug material comprising the plug does not adversely interact with the trench masking layer;

etching the patterned low-k material layer at the exposed portion using the patterned trench masking layer as a mask to form a trench opening substantially centered over the via hole; the patterned low-k material layer etching also removing some of the plug to form a partially etched plug; the trench opening and the via hole comprising a dual-damascene opening;

removing the partially etched plug from the via hole; and forming a planarized dual-damascene structure within the dual-damascene opening.

2. The method of claim 1, wherein the structure is a semiconductor substrate; the low-k material layer is formed of oxide or silicon oxide; and the patterned trench masking layer is comprised of photoresist.

3. The method of claim 1, wherein the plug material is comprised of a material selected from the group consisting of:

(a) an acrylate polymer, copolymer or tertpolymer;
(b) a compound comprising:
  i) a polyhydroxystyrene polymer resin, a hydroxystyrene/styrene copolymer resin; a hydroxystyrene/acrylate copolymer resin; or a hydroxystyrene/styrene/acrylate tertpolymer resin;
  ii) a melamine material; and
  iii) a thermal acid generator;
(c) a compound comprising a Novolak resin and DNQ; and
(d) polyimide or polyamide.

4. The method of claim 1, wherein the plug material is comprised of a material selected from the group consisting of:
(a) an acrylate polymer, copolymer or tertpolymer;
(b) a compound comprising:
  i) from about 50 to 95% of a polyhydroxystyrene polymer resin, a hydroxystyrene/styrene copolymer resin; a hydroxystyrene/acrylate copolymer resin; or a hydroxystyrene/styrene/acrylate tertpolymer resin;
  ii) from about 5 to 50% of a melamine material; and
  iii) from about 0.1 to 10% of a thermal acid generator;
(c) a compound comprising a Novolak resin and DNQ having a Novolak:DNQ ratio of from about 100:30 to 100:5; and
(d) polyimide or polyamide.

5. The method of claim 1, wherein the plug material is comprised of a material selected from the group consisting of:
(a) an acrylate polymer, copolymer or tertpolymer;
(b) a compound comprising:
  i) from about 60 to 90% of a polyhydroxystyrene polymer resin, a hydroxystyrene/styrene copolymer resin; a hydroxystyrene/acrylate copolymer resin; or a hydroxystyrene/styrene/acrylate tertpolymer resin;
  ii) from about 7 to 25% of a melamine material; and
  iii) from about 0.1 to 3% of a thermal acid generator;
(c) a compound comprising a Novolak resin and DNQ having a Novolak:DNQ ratio of from about 100:20 to 100:5; and
(d) polyimide or polyamide.

6. The method of claim 1, wherein the plug material is comprised of a material selected from the group consisting of:
(a) an acrylate polymer, copolymer or tertpolymer;
(b) a compound comprising:
  i) a polyhydroxystyrene polymer resin, a hydroxystyrene/styrene copolymer resin; a hydroxystyrene/acrylate copolymer resin; or a hydroxystyrene/styrene/acrylate tertpolymer resin;
  ii) a melamine material; and
  iii) a thermal acid generator selected from the group consisting of 2, 4, 4, 6 tetrabromocylohexadienone, benzointosylate, 2-nitrobenzyltosylate and other alkyl esters of organic sulfonic acids.
(c) a compound comprising a Novolak resin and DNQ; and
(d) polyimide or polyamide.

7. The method of claim 1, wherein the plug height is controlled by the time used to develop the plug material.

8. The method of claim 1, wherein a patterned ARC layer is formed over the patterned low-k material layer and the at least one via hole being formed through the patterned ARC layer and the patterned low-k material layer.

9. The method of claim 1, wherein a patterned ARC layer is formed over the patterned low-k material layer and the at least one via hole being formed through the patterned ARC layer and the patterned low-k material layer; the patterned ARC layer being comprised of an inorganic material selected from the group consisting of: SiON, SiOC, SiN and TaN.

10. The method of claim 1, wherein the plug is baked at a temperature of from about 150 to 350° C. for from about 30 to 300 seconds.

11. The method of claim 1, wherein the plug 40' is baked at a temperature of from about 150 to 250° C. for from about 45 to 120 seconds.

12. The method of claim 1, wherein the patterned low-k material layer is patterned using a patterned via masking layer.

13. The method of claim 1, wherein the patterned low-k material layer is patterned using a patterned via photoresist layer.

14. The method of claim 1, wherein the plug material is comprised of a material having functional groups selected from the group consisting of: —OH; —COOH and CONH —CONH$_2$.

15. The method of claim 1, wherein the plug material layer is comprised of a material dissolvable in TMAH or deionized water.

16. The method of claim 1, wherein the planarized dual-damascene structure within the dual-damascene opening is comprised of a material selected from the group consisting of copper, aluminum and gold.

17. A method of fabricating a dual-damascene structure, comprising the steps of:
providing a structure having a patterned low-k material layer formed thereover; the patterned low-k material layer having an upper surface and at least one via hole formed therethrough;
forming a plug material layer over the patterned low-k material layer and filling the at least one via hole; the plug material layer being comprised of a material dissolvable in TMAH or deionized water;
developing the plug material layer to form a plug within the respective at least one via hole having a height below the upper surface of the patterned low-k material layer;
baking the plug to crosslink the plug material comprising the plug;
forming and patterning a trench masking layer to form a patterned trench masking layer having at least one trench substantially centered over the respective at least one via hole and exposing a portion of patterned low-k material layer adjacent the at least one via hole; wherein the crosslinked plug material comprising the plug does not adversely interact with the trench masking layer;
etching the patterned low-k material layer at the exposed portion using the patterned trench masking layer as a mask to form a trench opening substantially centered over the via hole; the patterned low-k material layer etching also removing some of the plug to form a partially etched plug; the trench opening and the via hole comprising a dual-damascene opening;
removing the partially etched plug from the via hole; and
forming a planarized dual-damascene structure within the dual-damascene opening.

18. The method of claim 17, wherein the structure is a semiconductor substrate; the low-k material layer is formed of oxide or silicon oxide; and the patterned trench masking layer is comprised of photoresist.

19. The method of claim 17, wherein the plug material is comprised of a material selected from the group consisting of:
   (a) an acrylate polymer, copolymer or tertpolymer;
   (b) a compound comprising:
      i) a polyhydroxystyrene polymer resin, a hydroxystyrene/styrene copolymer resin; a hydroxystyrene/acrylate copolymer resin; or a hydroxystyrene/styrene/acrylate tertpolymer resin;
      ii) a melamine material; and
      iii) a thermal acid generator;
   (c) a compound comprising a Novolak resin and DNQ; and
   (d) polyimide or polyamide.

20. The method of claim 17, wherein the plug material is comprised of a material selected from the group consisting of:
   (a) an acrylate polymer, copolymer or tertpolymer;
   (b) a compound comprising:
      i) from about 50 to 95% of a polyhydroxystyrene polymer resin, a hydroxystyrene/styrene copolymer resin; a hydroxystyrene/acrylate copolymer resin; or a hydroxystyrene/styrene/acrylate tertpolymer resin;
      ii) from about 5 to 50% of a melamine material; and
      iii) from about 0.1 to 10% of a thermal acid generator;
   (c) a compound comprising a Novolak resin and DNQ having a Novolak:DNQ ratio of from about 100:30 to 100:5; and
   (d) polyimide or polyamide.

21. The method of claim 17, wherein the plug material is comprised of a material selected from the group consisting of:
   (a) an acrylate polymer, copolymer or tertpolymer;
   (b) a compound comprising:
      i) from about 60 to 90% of a polyhydroxystyrene polymer resin, a hydroxystyrene/styrene copolymer resin; a hydroxystyrene/acrylate copolymer resin; or a hydroxystyrene/styrene/acrylate tertpolymer resin;
      ii) from about 7 to 25% of a melamine material; and
      iii) from about 0.1 to 3% of a thermal acid generator;
   (c) a compound comprising a Novolak resin and DNQ having a Novolak:DNQ ratio of from about 100:20 to 100:5; and
   (d) polyimide or polyamide.

22. The method of claim 17, wherein the plug material is comprised of a material selected from the group consisting of:
   (a) an acrylate polymer, copolymer or tertpolymer;
   (b) a compound comprising:
      i) a polyhydroxystyrene polymer resin, a hydroxystyrene/styrene copolymer resin; a hydroxystyrene/acrylate copolymer resin; or a hydroxystyrene/styrene/acrylate tertpolymer resin;
      ii) a melamine material; and
      iii) a thermal acid generator selected from the group consisting of 2, 4, 4, 6 tetrabromocylohexadienone, benzointosylate, 2-nitrobenzyltosylate and other alkyl esters of organic sulfonic acids.
   (c) a compound comprising a Novolak resin and DNQ; and
   (d) polyimide or polyamide.

23. The method of claim 17, wherein the plug height is controlled by the time used to develop the plug material.

24. The method of claim 17, wherein a patterned ARC layer is formed over the patterned low-k material layer and the at least one via hole being formed through the patterned ARC layer and the patterned low-k material layer.

25. The method of claim 17, wherein a patterned ARC layer is formed over the patterned low-k material layer and the at least one via hole being formed through the patterned ARC layer and the patterned low-k material layer; the patterned ARC layer being comprised of an inorganic material selected from the group consisting of: SiON, SiOC, SiN and TaN.

26. The method of claim 17, wherein the plug is baked at a temperature of from about 150 to 350° C. for from about 30 to 300 seconds.

27. The method of claim 17, wherein the plug 40' is baked at a temperature of from about 150 to 250° C. for from about 45 to 120 seconds.

28. The method of claim 17, wherein the patterned low-k material layer is patterned using a patterned via masking layer.

29. The method of claim 17, wherein the patterned low-k material layer is patterned using a patterned via photoresist layer.

30. The method of claim 17, wherein the plug material is comprised of a material having functional groups selected from the group consisting of: —OH; —COOH and —$CONH_2$.

31. The method of claim 17, wherein the planarized dual-damascene structure within the dual-damascene opening is comprised of a material selected from the group consisting of copper, aluminum and gold.

32. A method of fabricating a dual-damascene structure, comprising the steps of:
   providing a semiconductor substrate having a patterned low-k material layer formed thereover; the patterned low-k material layer having an upper surface and at least one via hole formed therethrough; the low-k material layer being comprised of oxide or silicon oxide;
   forming a plug material layer over the patterned low-k material layer and filling the at least one via hole; the plug material layer being comprised of a material dissolvable in TMAH or deionized water;
   developing the plug material layer to form a plug within the respective at least one via hole having a height below the upper surface of the patterned low-k material layer;
   baking the plug to crosslink the plug material comprising the plug;
   forming and patterning a trench masking photoresist layer to form a patterned trench masking photoresist layer having at least one trench substantially centered over the respective at least one via hole and exposing a portion of patterned low-k material layer adjacent the at least one via hole; wherein the crosslinked plug material comprising the plug does not adversely interact with the trench masking photoresist layer;
   etching the patterned low-k material layer at the exposed portion using the patterned trench masking photoresist layer as a mask to form a trench opening substantially centered over the via hole; the patterned low-k material layer etching also removing some of the plug to form a partially etched plug; the trench opening and the via hole comprising a dual-damascene opening;
   removing the partially etched plug from the via hole; and
   forming a planarized dual-damascene structure within the dual-damascene opening.

33. The method of claim 32, wherein the plug material is comprised of a material selected from the group consisting of:
(a) an acrylate polymer, copolymer or tertpolymer;
(b) a compound comprising:
   i) a polyhydroxystyrene polymer resin, a hydroxystyrene/styrene copolymer resin; a hydroxystyrene/acrylate copolymer resin; or a hydroxystyrene/styrene/acrylate tertpolymer resin;
   ii) a melamine material; and
   iii) a thermal acid generator;
(c) a compound comprising a Novolak resin and DNQ; and
(d) polyimide or polyamide.

34. The method of claim 32, wherein the plug material is comprised of a material selected from the group consisting of:
(a) an acrylate polymer, copolymer or tertpolymer;
(b) a compound comprising:
   i) from about 50 to 95% of a polyhydroxystyrene polymer resin, a hydroxystyrene/styrene copolymer resin; a hydroxystyrene/acrylate copolymer resin; or a hydroxystyrene/styrene/acrylate tertpolymer resin;
   ii) from about 5 to 50% of a melamine material; and
   iii) from about 0.1 to 10% of a thermal acid generator;
(c) a compound comprising a Novolak resin and DNQ having a Novolak:DNQ ratio of from about 100:30 to 100:5; and
(d) polyimide or polyamide.

35. The method of claim 32, wherein the plug material is comprised of a material selected from the group consisting of:
(a) an acrylate polymer, copolymer or tertpolymer;
(b) a compound comprising:
   i) from about 60 to 90% of a polyhydroxystyrene polymer resin, a hydroxystyrene/styrene copolymer resin; a hydroxystyrene/acrylate copolymer resin; or a hydroxystyrene/styrene/acrylate tertpolymer resin;
   ii) from about 7 to 25% of a melamine material; and
   iii) from about 0.1 to 3% of a thermal acid generator;
(c) a compound comprising a Novolak resin and DNQ having a Novolak:DNQ ratio of from about 100:20 to 100:5; and
(d) polyimide or polyamide.

36. The method of claim 32, wherein the plug material is comprised of a material selected from the group consisting of:
(a) an acrylate polymer, copolymer or tertpolymer;
(b) a compound comprising:
   i) a polyhydroxystyrene polymer resin, a hydroxystyrene/styrene copolymer resin; a hydroxystyrene/acrylate copolymer resin; or a hydroxystyrene/styrene/ acrylate tertpolymer resin;
   ii) a melamine material; and
   iii) a thermal acid generator selected from the group consisting of 2, 4, 4, 6 tetrabromocylohexadienone, benzointosylate, 2-nitrobenzyltosylate and other alkyl esters of organic sulfonic acids.
(c) a compound comprising a Novolak resin and DNQ; and
(d) polyimide or polyamide.

37. The method of claim 32, wherein the plug height is controlled by the time used to develop the plug material.

38. The method of claim 32, wherein a patterned ARC layer is formed over the patterned low-k material layer and the at least one via hole being formed through the patterned ARC layer and the patterned low-k material layer.

39. The method of claim 32, wherein a patterned ARC layer is formed over the patterned low-k material layer and the at least one via hole being formed through the patterned ARC layer and the patterned low-k material layer; the patterned ARC layer being comprised of an inorganic material selected from the group consisting of: SiON, SiOC, SiN and TaN.

40. The method of claim 32, wherein the plug is baked at a temperature of from about 150 to 350° C. for from about 30 to 300 seconds.

41. The method of claim 32, wherein the plug 40' is baked at a temperature of from about 150 to 250° C. for from about 45 to 120 seconds.

42. The method of claim 32, wherein the patterned low-k material layer is patterned using a patterned via masking layer.

43. The method of claim 32, wherein the patterned low-k material layer is patterned using a patterned via photoresist layer.

44. The method of claim 32, wherein the plug material is comprised of a material having functional groups selected from the group consisting of: —OH; —COOH and —CONH$_2$.

45. The method of claim 32, wherein the planarized dual-damascene structure within the dual-damascene opening is comprised of a material selected from the group consisting of copper, aluminum and gold.

* * * * *